US012805053B2

(12) United States Patent
Chen et al.

(10) Patent No.: US 12,805,053 B2
(45) Date of Patent: Nov. 17, 2026

(54) P-TYPE BACK CONTACT CELL, PREPARATION METHOD THEREFOR, AND PHOTOVOLTAIC MODULE

(71) Applicant: HENGDIAN GROUP DMEGC MAGNETICS CO., LTD, Jinhua (CN)

(72) Inventors: Weikang Chen, Jinhua (CN); Qingshan Du, Jinhua (CN); Lanlan Ma, Jinhua (CN)

(73) Assignee: Hengdian Group DMEGC Magnetics Co., Ltd, Jinhua (CN)

( * ) Notice: Subject to any disclaimer, the term of this patent is extended or adjusted under 35 U.S.C. 154(b) by 0 days.

(21) Appl. No.: 18/710,995

(22) PCT Filed: Jul. 25, 2023

(86) PCT No.: PCT/CN2023/109020
§ 371 (c)(1),
(2) Date: May 16, 2024

(87) PCT Pub. No.: WO2024/221627
PCT Pub. Date: Oct. 31, 2024

(65) Prior Publication Data
US 2026/0173569 A1 Jun. 18, 2026

(30) Foreign Application Priority Data
Apr. 23, 2023 (CN) ......................... 202310456740.5

(51) Int. Cl.
*H10F 71/00* (2025.01)
*H10F 77/20* (2025.01)

(52) U.S. Cl.
CPC ......... *H10F 71/129* (2025.01); *H10F 77/219* (2025.01)

(58) Field of Classification Search
None
See application file for complete search history.

(56) References Cited

U.S. PATENT DOCUMENTS

2016/0181444 A1 6/2016 Smith
2023/0143714 A1* 5/2023 Xu ........................ H10F 77/703 257/79
2024/0097060 A1* 3/2024 Lin ....................... H10F 10/146

FOREIGN PATENT DOCUMENTS

CN 113851555 A 12/2021
CN 115020508 A 9/2022
(Continued)

OTHER PUBLICATIONS

International Search Report for International Appl. No. PCT/CN2023/109020, dated Jan. 2, 2024.
(Continued)

*Primary Examiner* — Daniel P Malley, Jr.
(74) *Attorney, Agent, or Firm* — Andrus Intellectual Property Law, LLP

(57) ABSTRACT

A P-type back contact cell, a preparation method therefor, and a photovoltaic module. The preparation method for the P-type back contact cell includes preparing a process wafer of the P-type back contact cell. An impurity-absorbing structure is formed on a first and/or second surface side. The impurity-absorbing structure includes a second tunnel layer, a second polycrystalline silicon layer, and a second phosphosilicate glass layer which are stacked. The process wafer is etched having the impurity-absorbing structure formed to remove the impurity-absorbing structure and the first phosphosilicate glass layer on the second surface side. A passivation layer is formed on the first and second surface sides of the process wafer. by forming an impurity-absorbing structure on the process wafer of the P-type back contact cell, the impurities are absorbed. Recombination centers formed by impurities are reduced. Carrier transfer efficiency is improved. Conversion efficiency of the P-type back contact cell is improved.

10 Claims, 9 Drawing Sheets

(56) References Cited

FOREIGN PATENT DOCUMENTS

| | | | |
|---|---|---|---|
| CN | 115312633 | A | 11/2022 |
| JP | 2014170774 | A | 9/2014 |
| KR | 20110060170 | A | 6/2011 |
| WO | 2023050824 | A1 | 4/2023 |

OTHER PUBLICATIONS

Extended European Search Report for EP Patent Appl. No. 23889838.1, dated Aug. 28, 2025.

Notice of Reasons for Refusal for JP Patent Appl. No. 2025-543770, dated Aug. 17, 2026.

* cited by examiner

P-TYPE BACK CONTACT CELL, PREPARATION METHOD THEREFOR, AND PHOTOVOLTAIC MODULE

CROSS-REFERENCE TO RELATED APPLICATIONS

This is a national stage application filed under 37 U.S.C. 371 based on International Patent Application No. PCT/CN2023/109020, filed Jul. 25, 2023, which claims priority to Chinese Patent Application No. 202310456740.5, filed on Apr. 23, 2023, the disclosures of which are incorporated herein by reference in their entireties.

TECHNICAL FIELD

Embodiments of the present application relate to the technical field of solar cells, for example, a P-type back contact cell, a preparation method therefor, and a photovoltaic module.

BACKGROUND

At present, with the gradual depletion of fossil fuel resources, solar cells are more and more widely used as a new alternative energy solution. The solar cells are a device that converts the sunlight energy into electrical energy. The solar cells can generate carriers based on the photovoltaic effect, and then send the carriers out by electrodes, thereby converting solar energy into electrical energy for use.

The most essential characteristic of the P-type back contact solar cells is that the emitter and metallic contact are on the back of the cells, and the front side is not sheltered by the metal electrode; hence, the cells have a higher short-circuit current Isc, and meanwhile, accommodate wide metal grid lines on the back to reduce the series resistance Rs and accordingly increase the fill factor FF; and such cells without shielding on the front not only have high conversion efficiency, but also a satisfactory appearance. Meanwhile, the components of all-back electrodes are easier to assemble. The back contact cells are currently one of the technological directions for realizing high-efficiency crystalline silicon cells.

However, the laser-ablation area in P-type back contact cells is not subjected to the annealing treatment in PERCs (Passivated Emitter Rear Cell), and thus there are still a large number of recombination centers. Therefore, it is an urgent problem to be solved how to reduce recombination centers and in turn increase the conversion efficiency of the cells.

SUMMARY

The following is a summary of the subject described in detail herein. This summary is not intended to limit the protection scope of the claims.

Embodiments of the present application provide a P-type back contact cell, a preparation method therefor, and a photovoltaic module, which is used to reduce recombination centers formed by impurities, improve the transport efficiency of carriers, and thereby improve the conversion efficiency of the P-type back contact cell.

In a first aspect, an embodiment of the present application provides a preparation method for a P-type back contact cell, comprising:

preparing a process wafer of the P-type back contact cell; the process wafer comprises a P-type silicon substrate; the P-type silicon substrate comprises a first surface and a second surface which are opposite; the second surface side is provided with a first tunnel layer, a first polycrystalline silicon layer, and a first phosphosilicate glass layer which are stacked in sequence, as well as a groove breaking through the first tunnel layer, the first polycrystalline silicon layer, and the first phosphosilicate glass layer;

forming an impurity-absorbing structure on the first surface side and/or the second surface side; the impurity-absorbing structure comprises a second tunnel layer, a second polycrystalline silicon layer, and a second phosphosilicate glass layer which are stacked;

etching the process wafer with the impurity-absorbing structure formed to remove the impurity-absorbing structure and the first phosphosilicate glass layer which is on the second surface side; and forming a passivation layer on each of the first surface side and the second surface side of the process wafer.

Optionally, the preparation of the process wafer of the P-type back contact cell comprises:

providing a P-type silicon substrate;

forming the first tunnel layer, the first polycrystalline silicon layer, and the first phosphosilicate glass layer which are stacked in sequence on each of the first surface side and the second surface side of the P-type silicon substrate;

forming a hole on the first phosphosilicate glass layer on the second surface side to expose a part of the first polycrystalline silicon layer on the second surface side;

after the hole is formed on the first phosphosilicate glass layer on the second surface side, removing the first phosphosilicate glass layer on the first surface side of the P-type silicon substrate to expose the first polycrystalline silicon layer on the first surface side; and etching on the first surface side and the second surface side of the P-type silicon substrate, based on which the first polycrystalline silicon layer and the first tunnel layer inside the hole are removed to form the groove at the hole, and the first tunnel layer and the first polycrystalline silicon layer which are located on the first surface side are removed.

Optionally, the preparation of the process wafer of the P-type back contact cell comprises:

providing a P-type silicon substrate;

forming the first tunnel layer, the first polycrystalline silicon layer, and the first phosphosilicate glass layer which are stacked in sequence on each of the first surface side and the second surface side of the P-type silicon substrate;

removing the first phosphosilicate glass layer on the first surface side of the P-type silicon substrate to expose the first polycrystalline silicon layer on the first surface side;

after the first phosphosilicate glass layer on the first surface side of the P-type silicon substrate is removed, forming a hole on the first phosphosilicate glass layer on the second surface side to expose a part of the first polycrystalline silicon layer on the second surface side; and etching on the first surface side and the second surface side of the P-type silicon substrate, based on which the first polycrystalline silicon layer and the first tunnel layer inside the hole are removed to form the groove at the hole, and the first tunnel layer and the first polycrystalline silicon layer which are located on the first surface side are removed.

Optionally, etching on the first surface side and the second surface side of the P-type silicon substrate comprises:

using an alkaline corrosive solution to corrode on the first surface side and at the hole on the second surface side of the P-type silicon substrate, based on which the first polycrystalline silicon layer and the first tunnel layer inside the hole are removed to form the groove at the hole, and the first tunnel layer and the first polycrystalline silicon layer which are located on the first surface side are removed.

Optionally, forming the hole on the first phosphosilicate glass layer on the second surface side to expose a part of the first polycrystalline silicon layer on the second surface side comprises:

using laser to form the hole on the first phosphosilicate glass layer on the second surface side of the P-type silicon substrate.

Optionally, forming the impurity-absorbing structure on the first surface side and/or the second surface side comprises:

sequentially preparing the first tunnel layer, the first polycrystalline silicon layer, and the first phosphosilicate glass layer on the first surface side and the second surface side by any one of high-temperature thermal oxidation, nitric acid oxidation, ozone oxidation, and chemical vapor deposition.

Optionally, etching the process wafer with the impurity-absorbing structure formed to remove the impurity-absorbing structure and the first phosphosilicate glass layer on the second surface side comprises:

etching the second phosphosilicate glass layer on the second surface side, and the second polycrystalline silicon layer and the second tunnel layer which are on the second surface side to form a groove having a polished surface on the second surface side;

etching the second phosphosilicate glass layer and the second polycrystalline silicon layer which are on the first surface side to remove the second polycrystalline silicon layer; and etching the second tunnel layer and the second tunnel layer which is on the first surface side to remove the first phosphosilicate glass layer and the second tunnel layer which is on the first surface side.

Optionally, forming the passivation layer on each of the first surface side and the second surface side of the process wafer comprises:

preparing an aluminum oxide layer on the first surface side and the second surface side of the process wafer; and preparing a silicon nitride layer on a side facing away from the P-type silicon substrate of the aluminum oxide layer on the first surface side and the second surface side.

In a second aspect, an embodiment of the present application provides a P-type back contact cell, which is prepared by the preparation method for a back contact cell according to the first aspect.

In a third aspect, an embodiment of the present application provides a photovoltaic module comprising the P-type back contact cell according to the second aspect.

In the technical solutions provided in the embodiments of the present application, by forming an impurity-absorbing structure on the first surface side and the second surface side of the process wafer of the P-type back contact cell, the impurities on the first surface side and the second surface side of the process wafer are absorbed, the recombination centers formed by impurities are reduced, the transfer efficiency of carriers is improved, and thus the conversion efficiency of the P-type back contact cell is improved. After completing the impurity absorption on the first surface side and the second surface side of the impurity-absorbing structure, the process wafer with the impurity-absorbing structure formed is etched to remove the impurity-absorbing structure and the first phosphosilicate glass layer which is on the second surface side, and then a passivation layer is formed on each of the first surface side and the second surface side of the process wafer, so as to protect the P-type back contact cell and prevent external contaminants from entering into the P-type back contact cell, thereby improving the photoelectric conversion efficiency of the P-type back contact cell.

After the accompanying drawings and detailed description are read and understood, other aspects can be understood.

BRIEF DESCRIPTION OF DRAWINGS

Accompanying drawings are used to provide a further understanding of the technical solutions herein, form part of the specification, explain the technical solutions together with embodiments of the present application, and do not limit the technical solutions herein.

DETAILED DESCRIPTION

The technical solutions of the present application are further explained by accompanying drawings and embodiments below. It is understood that the specific embodiments described herein are used only to explain the present application and should not be a limitation to the present application. It should also be noted that, for ease of description, only some, not all, of the structures relevant to the present application are shown in the accompanying drawings.

Figure 1:
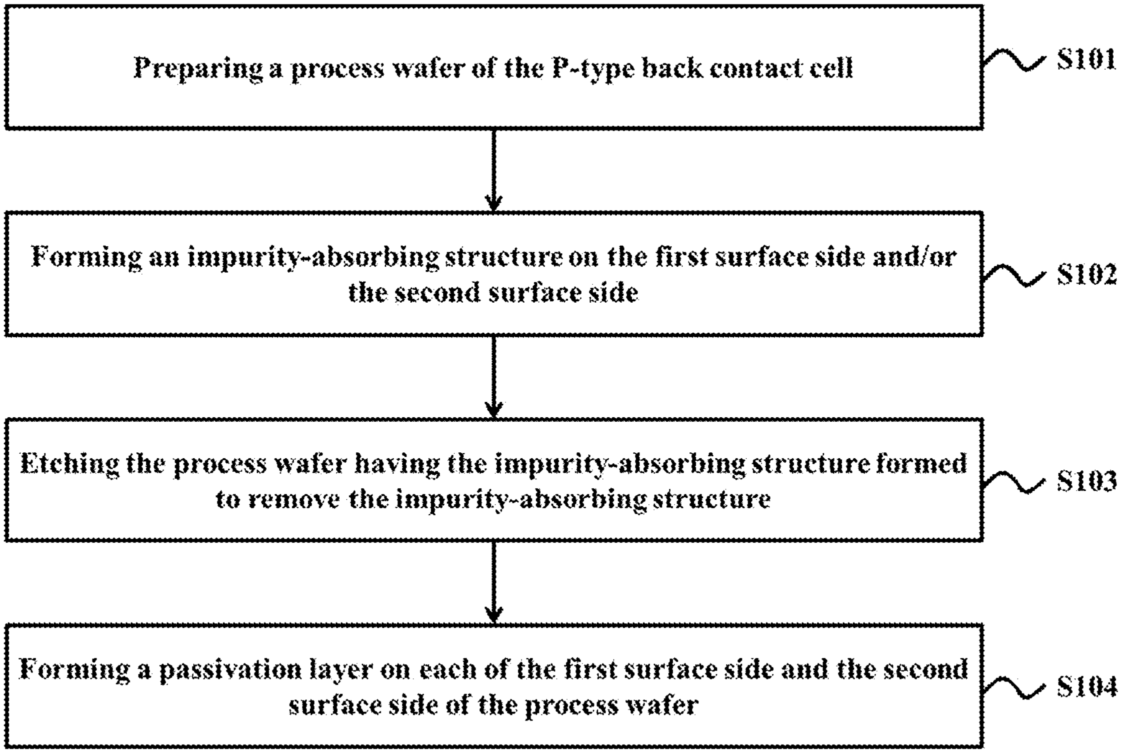
FIG. 1 is a flow chart showing a preparation method for a P-type back contact cell provided in an embodiment of the present application.
Figure 2:
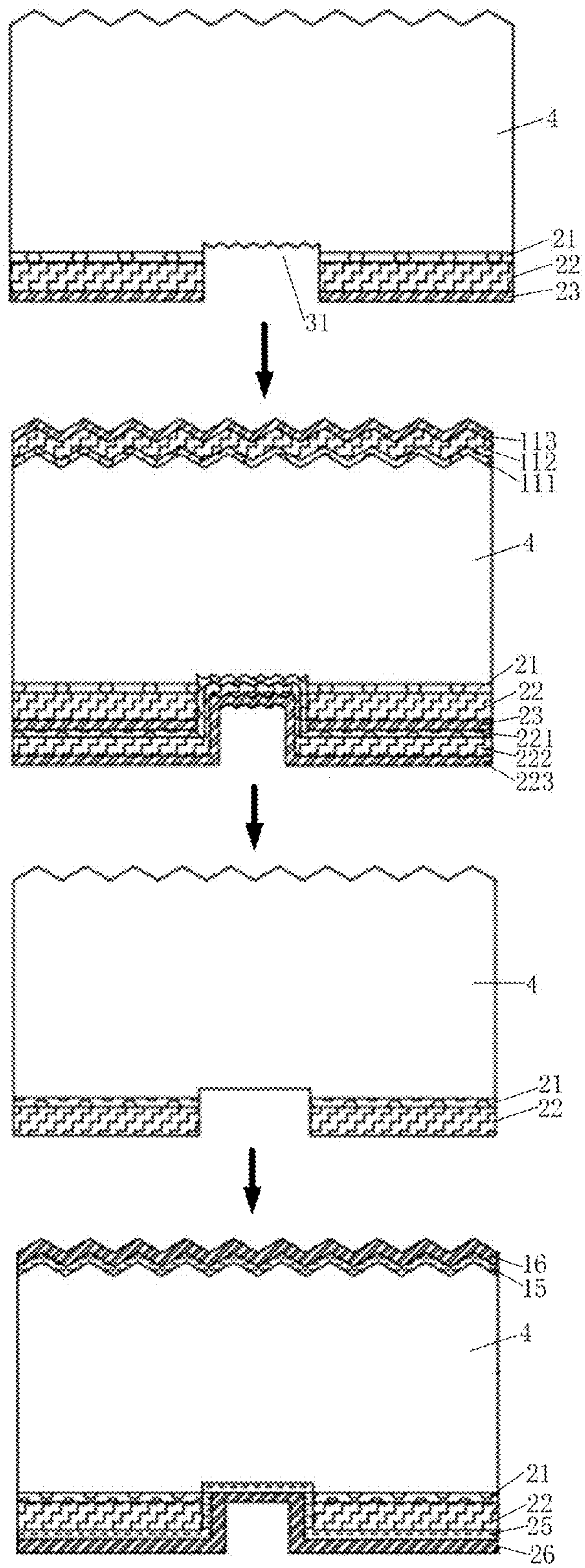
FIG. 2 is a structural schematic diagram showing a preparation process for a P-type back contact cell provided in an embodiment of the present application.

An embodiment of the present application provides a preparation method for a P-type back contact cell, and this method is suitable for the preparation of a P-type back contact cell provided in an embodiment of the present application. FIG. 1 is a flow chart showing a preparation method for a P-type back contact cell provided in an embodiment of the present application; FIG. 2 is a structural schematic diagram showing a preparation process for a P-type back contact cell provided in an embodiment of the present application. As shown in FIG. 1, the preparation method for a P-type back contact cell comprises:

S101, preparation of a process wafer of the P-type back contact cell.

In S101, the process wafer comprises a P-type silicon substrate; the P-type silicon substrate comprises a first surface and a second surface which are opposite; the second surface side is provided with a first tunnel layer, a first polycrystalline silicon layer, and a first phosphosilicate glass layer which are stacked in sequence, and a groove breaking through the first tunnel layer, the first polycrystalline silicon layer, and the first phosphosilicate glass layer.

Specifically, the P-type silicon substrate can be a wafer or a silicon wafer doped with a trivalent element such as boron or gallium, and Si in a semiconductor is a tetravalent element, and can form electron-hole pairs with a trivalent element, and then a large number of holes can be generated in the wafer or silicon wafer, thus forming the P-type silicon substrate.

Referring to FIG. 2, the first tunnel layer 21 and the first polycrystalline silicon layer 22 can be formed on the second surface side by the preparation method of low-pressure chemical vapor deposition, and after the first tunnel layer 21 and the first polycrystalline silicon layer 22 are formed, the P-type silicon substrate with the formed first tunnel layer 21 and the formed first polycrystalline silicon layer 22 is put into a low-pressure diffusion furnace, and a phosphorus source is deposited on the second surface side to form the first phosphosilicate glass layer 23. The groove 31 is formed by laser or etching at a corresponding region for the finger on the second surface side, and the groove 31 breaks through the first tunnel layer 21, the first polycrystalline silicon layer 22, and the first phosphosilicate glass layer 23.

Understandably, the materials and thicknesses of the first tunnel layer 21, the first polycrystalline silicon layer 22, and the first phosphosilicate glass layer 23 can be set according to the actual need, which are not particularly defined herein. For example, a material of the first tunnel layer 21 can comprise, but is not limited to, one or more of silicon oxide, aluminum oxide, titanium oxide, chromium dioxide, gallium oxide, tantalum pentoxide, niobium pentoxide, silicon nitride, silicon carbonitride, aluminum nitride, titanium nitride, and titanium carbonitride; a thickness of the first tunnel layer 21 can be 1.1-1.8 nm, and a thickness of the first polycrystalline silicon layer 22 can be 70-180 nm; the first phosphosilicate glass layer 23 comprises silicon oxide, phosphorus oxide, and other elements, wherein a deposition concentration of the phosphorus source can be $3e^{20}$-$4e^{22}/cm^3$.

S102, forming an impurity-absorbing structure on the first surface side and/or the second surface side.

In S102, the impurity-absorbing structure comprises a second tunnel layer, a second polycrystalline silicon layer, and a second phosphosilicate glass layer which are stacked.

Understandably, the impurity-absorbing structure is formed on the first surface side and/or the second surface side, which means that the impurity-absorbing structure can be only formed on the first surface side, or the impurity-absorbing structure can be only formed on the second surface side, or the impurity-absorbing structure can be formed on both of the first surface side and the second surface side. For ease of description, a case of the formation of impurity-absorbing structures on both the first surface side and the second surface side is used as an example for illustration.

Specifically, as shown in FIG. 2, the impurity-absorbing structure formed on the first surface side comprises the second tunnel layer 111, the second polycrystalline silicon layer 112, and the second phosphosilicate glass layer 113 which are stacked, and the impurity-absorbing structure formed on the second surface side comprises the second tunnel layer 221, the second polycrystalline silicon layer 222, and the second phosphosilicate glass layer 223 which are stacked. The preparation method of low-pressure chemical vapor deposition can be used to form the second tunnel layer 111 and the second polycrystalline silicon layer 112 on the first surface side, and form the second tunnel layer 221 and the second polycrystalline silicon layer 222 on the second surface side of the process wafer, and then the process wafer is put into a low-pressure diffusion furnace and subjected to the phosphorus diffusion, and during the phosphorus diffusion, the second phosphosilicate glass layer 113 is formed on the first surface side, and the second phosphosilicate glass layer 223 is formed on the second surface side.

In one optional embodiment, the method for forming an impurity-absorbing structure on the first surface side and the second surface side can comprise: the first tunnel layer, the first polycrystalline silicon layer, and the first phosphosilicate glass layer are prepared sequentially on the first surface side and the second surface side by using any one of high-temperature thermal oxidation, nitric acid oxidation, ozone oxidation, and chemical vapor deposition.

Specifically, metal impurities such as Fe, Na, Cu, and Au, and non-metal impurities such as O, C, and N may exist on the first surface side and the second surface side of the process wafer of the P-type silicon substrate. The presence of the above impurities will introduce deep-level defects into the silicon substrate, and these deep-level defects will trap majority carriers and minority carriers to become recombination centers of carriers, reducing the diffusion length of the minority carriers, thus decreasing the efficiency of the P-type back contact cell. In this case, for the impurity-absorbing structure formed on the first surface side and the second surface side, a material of the second tunnel layers 111 and 221 in the impurity-absorbing structure can comprise, but are not limited to, one of silicon oxide, aluminum oxide, titanium oxide, chromium dioxide, gallium oxide, tantalum pentoxide, niobium pentoxide, silicon nitride, silicon carbonitride, aluminum nitride, titanium nitride, and titanium carbonitride; the material difference of the first tunnel layers (111 and 221) and P-type silicon substrate, i.e., the second tunnel layers 111 and 221 having a larger solubility on impurities than the P-type silicon substrate, is used to perform impurity absorption on the first surface side and the second surface side. Exemplarily, the second tunnel layers 111 and 221 are made of aluminum oxide, and the solubility of the metal impurities in aluminum oxide is larger than the solubility of the metal impurities in the P-type silicon substrate. During the formation of the second phosphosilicate glass layers 113 and 223 of the impurity-absorbing structure, the phosphorus element in the second phosphosilicate glass layers 113 and 223 will diffuse into the second polycrystalline silicon layers 112 and 222; with the increase of the phosphorus concentration in the second polycrystalline silicon layers 112 and 222, the ability to accommodate impurities will also be enhanced, increasing the solubility of impurities in the polycrystalline silicon layers, and thereby reducing the impurity concentration in the P-type silicon substrate. In this way, the impurity-absorbing structure is formed on the first surface side and the second surface side to realize absorbing the impurities from the first surface side and the second surface side of the P-type silicon substrate, reducing the recombination centers formed by impurities, improving the transport efficiency of carriers, and thus improving the conversion efficiency of the P-type back contact cell.

Understandably, the material of the above second tunnel layer, the above second polycrystalline silicon layer, and the above second phosphosilicate glass layer can be the same as or different from the material of the first tunnel layer, the first polycrystalline silicon layer, and the first phosphosilicate glass layer, and the thickness of the second tunnel layer, the second polycrystalline silicon layer, and the second phosphosilicate glass layer can be set according to the actual need, which are not particularly defined herein. For example, a thickness of the second tunnel layers 111 and 221 can be 1-1.5 nm; a thickness of the second polycrystalline silicon layers 112 and 222 can be 60-120 nm; the second phosphosilicate glass layers 113 and 223 comprise silicon oxide, phosphorus oxide, and other elements, wherein a deposition concentration of the phosphorus source can be $1e^{20}$-$2e^{22}/cm^3$.

S103, etching the process wafer having the impurity-absorbing structure formed to remove the impurity-absorbing structure and the first phosphosilicate glass layer on the second surface side.

Specifically, the process wafer having the impurity-absorbing structure formed can be put into an inline etching machine, and the process wafer is etched by an alkaline corrosive solution or an acid corrosive solution to remove the impurity-absorbing structures on the first surface side and the second surface side as well as the first phosphosilicate glass layer on the second surface side.

S104, forming a passivation layer on each of the first surface side and the second surface side of the process wafer.

Specifically, the passivation layer can cover on each of the first surface side and the second surface side, which can prevent contaminants in the air from eroding the inside of the P-type back contact cell, protect the P-type back contact cell, provide hydrogen passivation at the same time, and reduce the interface recombination centers of the silicon wafer, thereby improving the photoelectric conversion efficiency of the P-type back contact cell.

Understandably, the material and the thickness of the above passivation layer can be set according to the actual need, which are not particularly defined herein. For example, the material of the passivation layer can comprise, but is not limited to, one of aluminum oxide, silicon carbide, or phosphorus oxide.

For the P-type back contact cell prepared by the above method provided in the embodiments of the present application, by forming an impurity-absorbing structure on the first surface side and the second surface side of the process wafer of the P-type back contact cell, the impurities on the first surface side and the second surface side of the process wafer are absorbed, the recombination centers formed by the impurities are reduced, the transfer efficiency of carriers is improved, and thus the conversion efficiency of the P-type back contact cell is improved. After the impurity-absorbing structure is formed on the first surface side and the second surface side of the process wafer of the P-type back contact cell, the process wafer having the impurity-absorbing structure formed is etched to remove the impurity-absorbing structure and the first phosphosilicate glass layer which is on the second surface side, so that a polished surface is formed at the groove on the second surface side. The polished surface can fully reflect light with various wavelengths, so that at least part of the light which needs to pass through the smooth polished surface to reach the second surface side is reflected into the P-type silicon substrate to realize the reuse of light, improve the utilization rate of light energy, and further improve the photoelectric conversion efficiency of back contact. Then, a passivation layer is formed on each of the first surface side and the second surface side of the process wafer, to protect the P-type back contact cell, prevent external contaminants from entering into the P-type back contact cell, provide hydrogen passivation at the same time, and reduce the interface recombination centers of the silicon wafer, thereby improving the photoelectric conversion efficiency of the P-type back contact cell.

Figure 3:
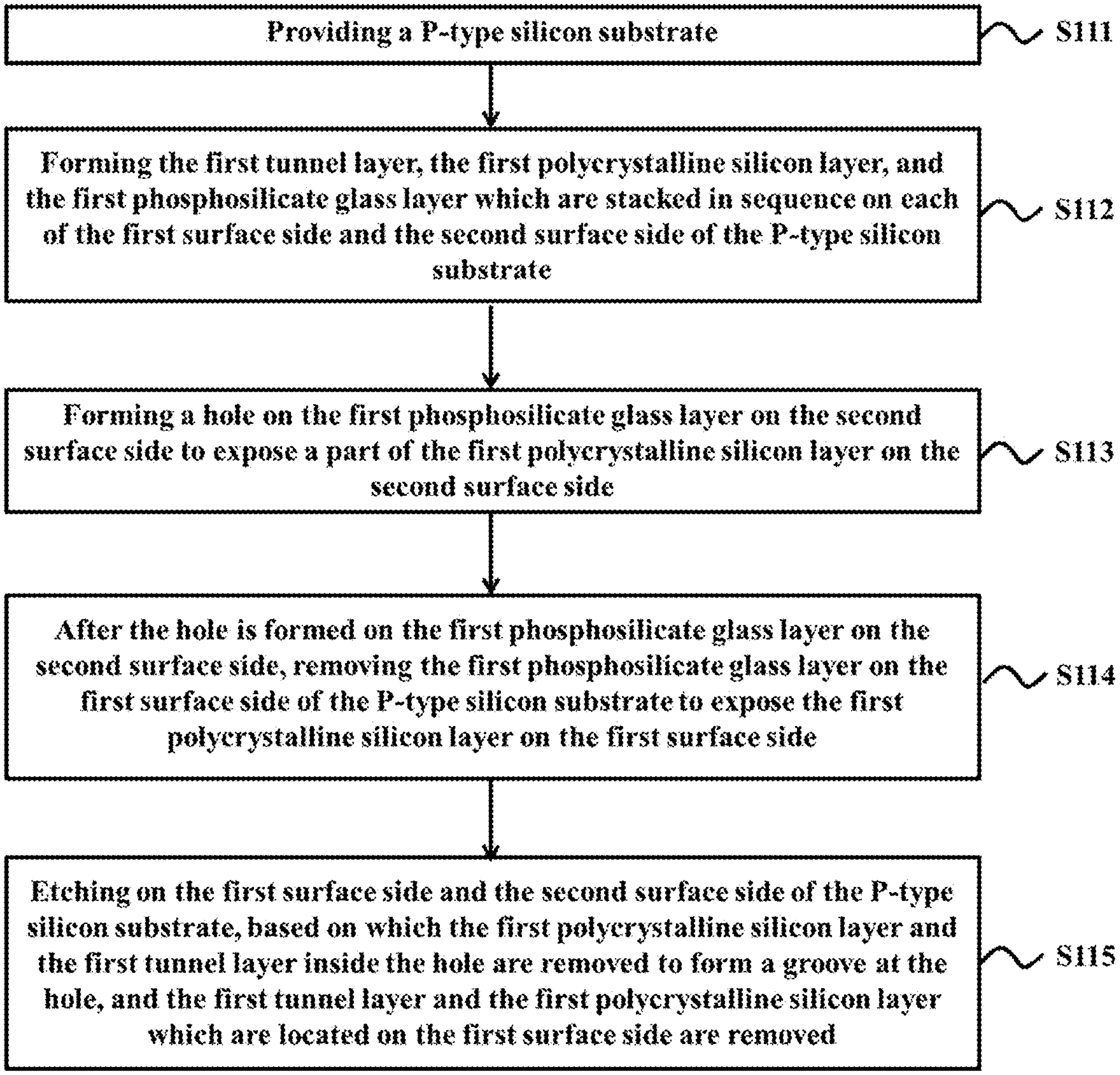
FIG. 3 is a flow chart showing a preparation method for a process wafer of a P-type back contact cell provided in an embodiment of the present application.
Figure 4:
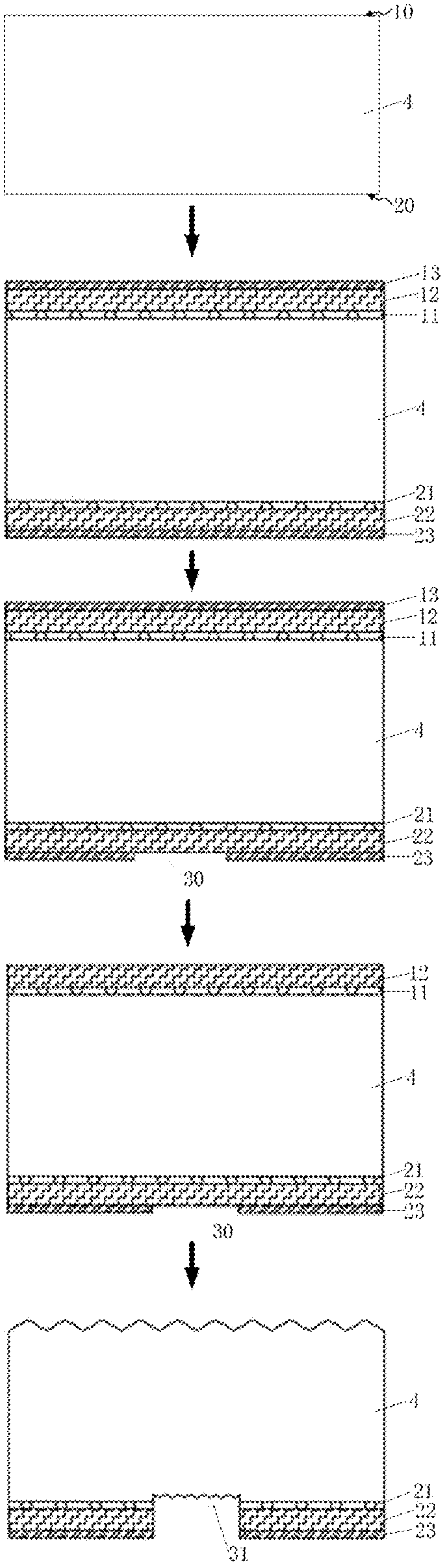
FIG. 4 is a structural schematic diagram showing a preparation process for a process wafer of a P-type back contact cell provided in an embodiment of the present application.

In one optional embodiment, FIG. 3 is a flow chart showing a preparation method for a process wafer of a P-type back contact cell provided in an embodiment of the present application; FIG. 4 is a structural schematic diagram showing a preparation process for a process wafer of a P-type back contact cell provided in an embodiment of the present application. As shown in FIG. 3, the preparation of the process wafer of the P-type back contact cell specifically comprises:

S111, providing a P-type silicon substrate.

Specifically, referring to FIG. 4, the P-type silicon substrate 4 has a first surface 10 and a second surface 20 which are opposite, and the first surface 10 and the second surface 20 are flat, so that other structures can be subsequently formed as a whole layer on the first surface 10 side and the second surface 20 side. The first surface 10 can be the front of the P-type back contact cell, namely, a surface receiving the light source, and the second surface 20 can be the back of the P-type back contact cell, namely, a surface facing away from the light source.

S112, forming the first tunnel layer, the first polycrystalline silicon layer, and the first phosphosilicate glass layer which are stacked in sequence on each of the first surface side and the second surface side of the P-type silicon substrate.

Specifically, referring to FIG. 4, the first tunnel layer 11, the first polycrystalline silicon layer 12, and the first phosphosilicate glass layer 13 which are stacked in sequence are formed on the first surface side 10 of the P-type silicon substrate 4, and the first tunnel layer 21, the first polycrystalline silicon layer 22, and the first phosphosilicate glass layer 23 which are stacked in sequence are formed on the second surface side 20, and the specific preparation process can be: first, the low-pressure chemical vapor deposition method can be used to form the first tunnel layer 11 and the first polycrystalline silicon layer 12 on the first surface 10 side of the P-type silicon substrate 4, and form the first tunnel layer 21 and the first polycrystalline silicon layer 22 on the second surface 20 side of the P-type silicon substrate 4, and then the process wafer is put into a low-pressure diffusion furnace to form the first phosphosilicate glass layer 13 and the first phosphosilicate glass layer 23 on the first surface 10 and the second surface side, respectively, and the phosphorus diffusion is performed in the low-pressure diffusion furnace, that is, the phosphorus in the first phosphosilicate glass layers 13 and 23 can be diffused into the first polycrystalline silicon layers 12 and 22 to form a high potential and a low potential.

S113, forming a hole on the first phosphosilicate glass layer on the second surface side to expose a part of the first polycrystalline silicon layer on the second surface side.

Specifically, referring to FIG. 4, the first phosphosilicate glass layer 23 on the second surface 20 side of the P-type silicon substrate 4 comprises a hole 30, and the hole 30 can expose the first polycrystalline silicon layer 22 on the second surface 20 side. The hole 30 can be obtained by, for example, physical grinding, ion beam etching, or laser, and the method is not specifically limited in the embodiments in the present application.

In one optional embodiment, a hole is formed on the first phosphosilicate glass layer on the second surface side to expose a part of the first polycrystalline silicon layer on the second surface side, which can comprise: the hole is formed on the first phosphosilicate glass layer on the second surface side of the P-type silicon substrate by laser. Due to the non-contact characteristic of the laser processing, the material is basically not affected, the size of the hole can be accurately controlled, and the processing efficiency and processing quality can be improved.

S114, after the hole is formed on the first phosphosilicate glass layer on the second surface side, removing the first phosphosilicate glass layer on the first surface side of the P-type silicon substrate to expose the first polycrystalline silicon layer on the first surface side.

Specifically, referring to FIG. 4, after the hole is formed on the first phosphosilicate glass layer 23 on the second surface 20 side, because the materials of the first phosphosilicate glass layer 13 and the first polycrystalline silicon layer 12 are different, the removal methods or processes are also different. The first phosphosilicate glass layer 13 is required to be removed before the first polycrystalline silicon layer 12 is removed, and the removal method can be laser etching and other methods, and the method is not specifically limited in the embodiments in the present application. For example, the process wafer can be put into an inline etching machine, and the first phosphosilicate glass layer 13 on the first surface 10 side can be etched by a hydrogen fluoride solution, the etching period is related to the concentration of the hydrogen fluoride solution and the thickness of the first phosphosilicate glass layer, and there is no specific limitation here. The concentration of the hydrogen fluoride solution can be 75-85%, and the etching can be performed for a period of 30-60 s.

S115, etching on the first surface side and the second surface side of the P-type silicon substrate, based on which the first polycrystalline silicon layer and the first tunnel layer inside the hole are removed to form a groove at the hole, and the first tunnel layer and the first polycrystalline silicon layer which are located on the first surface side are removed.

Specifically, referring to FIG. 4, after the first phosphosilicate glass layer 13 on the first surface 10 side of P-type silicon substrate 4 is removed, the liquid chemical reagent or plasma etching can be used to remove the first polycrystalline silicon layer 22 and the first tunnel layer 21 inside the hole 30, thereby forming the groove 31 at the hole 30, as well as remove the first tunnel layer 11 and the first polycrystalline silicon layer 12 which are located on the first surface 10 side, based on which pyramidal textures can be formed on the first surface 10 side of the P-type silicon substrate to increase the utilization rate of light and improve the photoelectric conversion efficiency of the P-type back contact cell. At the same time, pyramidal textures are also formed on the groove 31 which is formed at the hole of the second surface 20 side of the P-type silicon substrate.

Optionally, the method of etching on the first surface side and the second surface side of the P-type silicon substrate can comprise: the first surface side and the hole on the second surface side of the P-type silicon substrate are corroded by an alkaline corrosive solution, so that the first polycrystalline silicon layer and the first tunnel layer inside the hole are removed to form a groove at the hole, and the first tunnel layer and the first polycrystalline silicon layer which are located on the first surface are removed. The alkaline corrosive solution can be a sodium hydroxide solution, etc.

Specifically, referring to FIG. 4, the alkaline corrosive solution is used to corrode the first polycrystalline silicon layer 12 and the first tunnel layer 11 which are on the first surface 10 side, as well as the first polycrystalline silicon layer 22 and the first tunnel layer 21 inside the hole 30 on the second surface 20 side. The period for corrosion is related to the concentration of the alkaline corrosive solution, the thicknesses of the first polycrystalline silicon layer and the first tunnel layer, and the corrosion temperature, which is not particularly defined herein. In a case where the alkaline corrosive solution is a sodium hydroxide solution, the concentration of sodium hydroxide can be 1.3-5%, and the corrosion can be performed at a temperature of 74-82° C., and the corrosion can be performed for a period of 350-600 s.

Understandably, the above preparation method for the process wafer of the P-type back contact cell is only an exemplary method in the present application, and the preparation method for the process wafer of the P-type back contact cell in the embodiments of the present application is not limited thereto. For example, after the formation of the first tunnel layer, the first polycrystalline silicon layer, and the first phosphosilicate glass layer, the first phosphosilicate glass layer on the first surface side of the P-type silicon substrate can be first removed, and then a hole can be formed on the first phosphosilicate glass layer on the second surface side.

Figure 5:
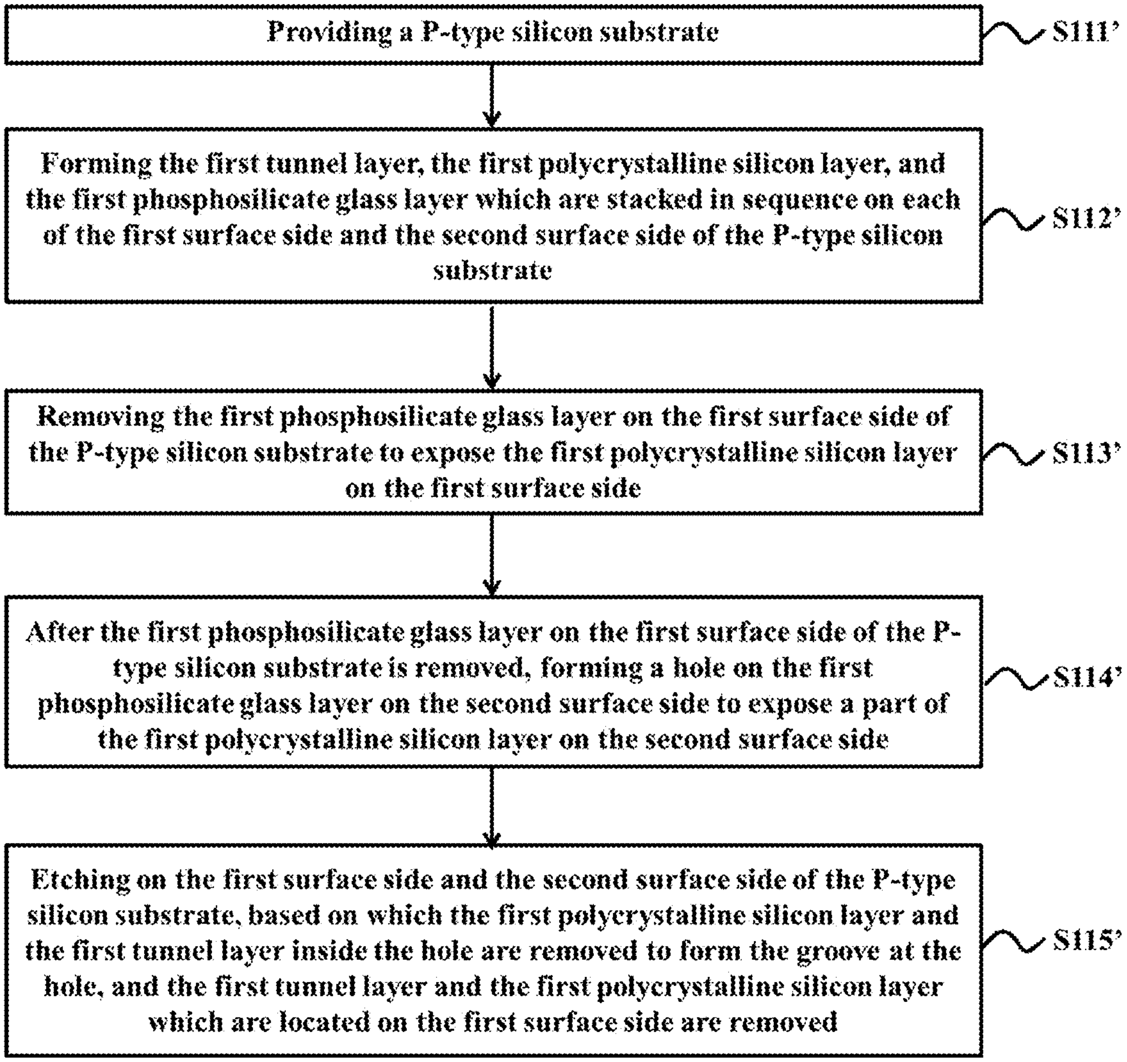
FIG. 5 is a flow chart showing another preparation method for a process wafer of a P-type back contact cell provided in an embodiment of the present application.
Figure 6:
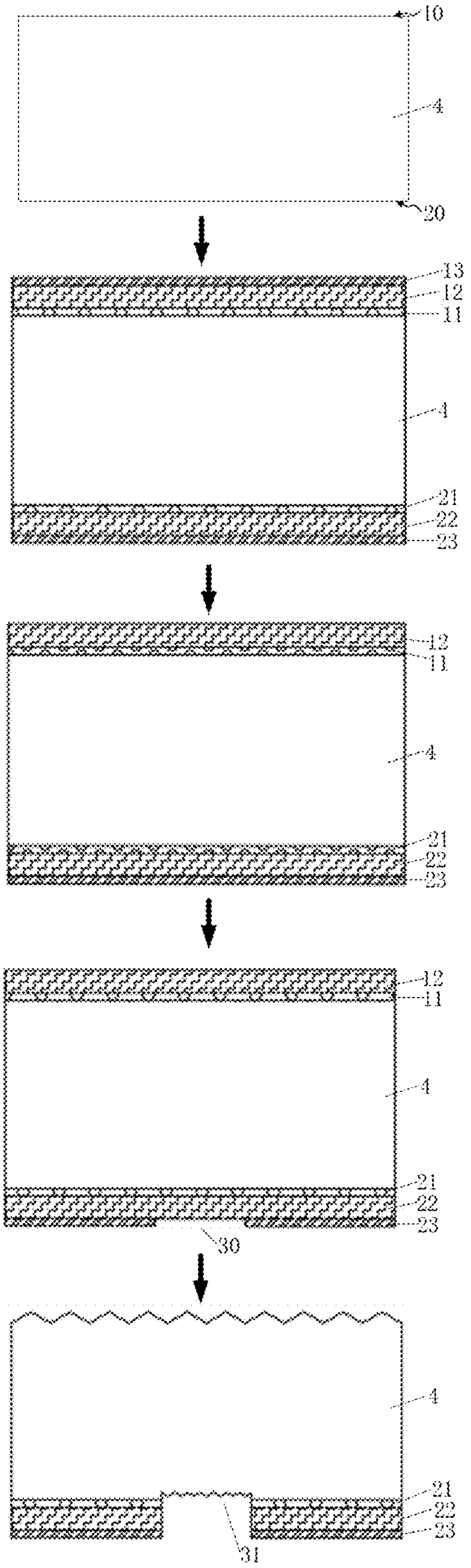
FIG. 6 is a structural schematic diagram showing another preparation process for a process wafer of a P-type back contact cell provided in an embodiment of the present application.

Optionally, FIG. 5 is a flow chart showing another preparation method for a process wafer of P-type back contact cell provided in an embodiment of the present application; FIG. 6 is a structural schematic diagram showing another preparation process for a process wafer of a P-type back contact cell provided in an embodiment of the present application. As shown in FIG. 5, the preparation of the process wafer of the P-type back contact cell can also comprise:

S111', Providing a P-type Silicon Substrate.

S112', forming the first tunnel layer, the first polycrystalline silicon layer, and the first phosphosilicate glass layer which are stacked in sequence on each of the first surface side and the second surface side of the P-type silicon substrate.

S113', removing the first phosphosilicate glass layer on the first surface side of the P-type silicon substrate to expose the first polycrystalline silicon layer on the first surface side.

Specifically, referring to FIG. 6, because the materials of the first phosphosilicate glass layer 13 and the first polycrystalline silicon layer 12 are different, and the removal methods or processes are also different, the first phosphosilicate glass layer 13 is required to be removed before the removal of the first polycrystalline silicon layer 12. The removal method can be laser etching and other methods, and the method is not specifically limited by the embodiments in the present application. For example, the process wafer can be put into an inline etching machine, and the first phosphosilicate glass layer 13 on the first surface 10 side can be etched by a hydrogen fluoride solution, wherein a concentration of the hydrogen fluoride solution can be 75-85%, and the etching can be performed for a period of 30-60 s.

S114', after the first phosphosilicate glass layer on the first surface side of the P-type silicon substrate is removed, forming a hole on the first phosphosilicate glass layer on the second surface side to expose a part of the first polycrystalline silicon layer on the second surface side.

Specifically, referring to FIG. 6, the hole 30 can be obtained by a method such as physical grinding, ion beam etching, or laser, and the method is not specifically limited in the embodiments in the present application.

Optionally, the hole is formed on the first phosphosilicate glass layer on the second surface side to expose a part of the first polycrystalline silicon layer on the second surface side; specifically, the hole is formed on the first phosphosilicate glass layer on the second surface side of the P-type silicon substrate by laser. Due to the non-contact characteristic of the laser processing, the material is basically not affected, the size of the hole can be accurately controlled, and the processing efficiency and processing quality can be improved.

S115', etching on the first surface side and the second surface side of the P-type silicon substrate, based on which the first polycrystalline silicon layer and the first tunnel layer inside the hole are removed to form a groove at the hole, and the first tunnel layer and the first polycrystalline silicon layer which are located on the first surface side are removed.

In the technical solutions provided in the embodiments of the present application, the first tunnel layer, the first polycrystalline silicon layer, and the first phosphosilicate glass layer which are stacked in sequence are formed on each of the first surface side and the second surface side of the P-type silicon substrate; the first phosphosilicate glass layer on the first surface side of the P-type silicon-based substrate can be first removed, and then the hole can be formed on the first phosphosilicate glass layer on the second surface side; or the hole can be formed on the first phosphosilicate glass layer on the second surface side first, and then the first phosphosilicate glass layer on the first surface side of the P-type silicon substrate can be removed; then, the first surface side and the second surface side of the P-type silicon substrate are etched, based on which the first polycrystalline silicon layer and the first tunnel layer inside the hole are removed to form a groove at the hole, and the first tunnel layer and the first polycrystalline silicon layer which are located on the first surface are removed to form pyramidal textures on the first surface side to increase the utilization rate of light and improve the photoelectric conversion efficiency of the P-type back contact cell.

Figure 7:
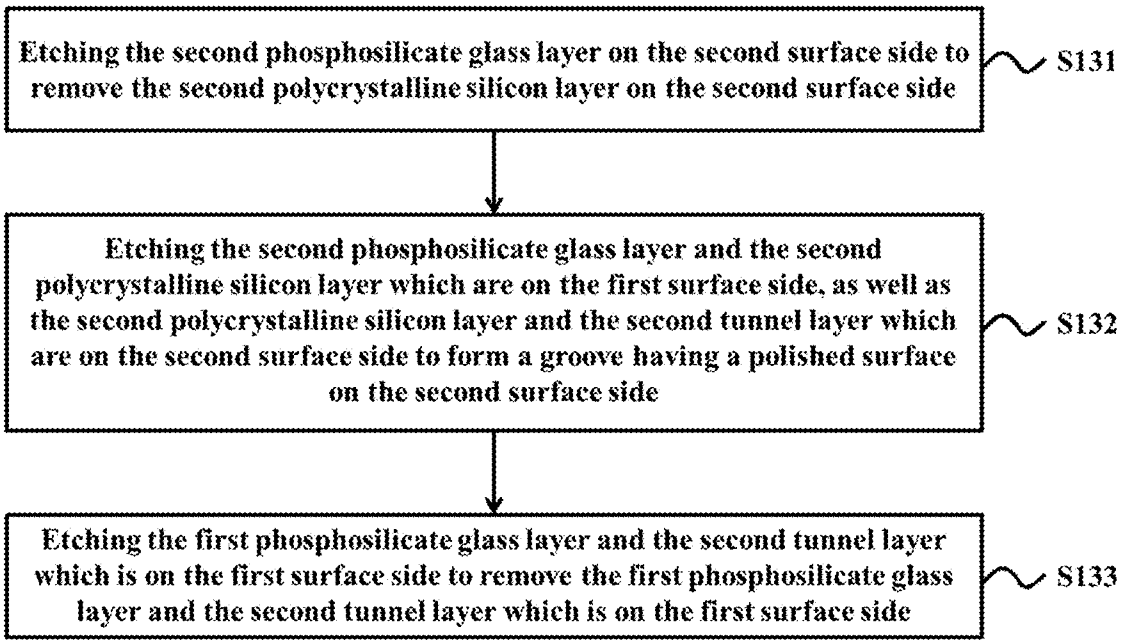
FIG. 7 is a flow chart showing another preparation method for a P-type back contact cell provided in an embodiment of the present application.
Figure 8:
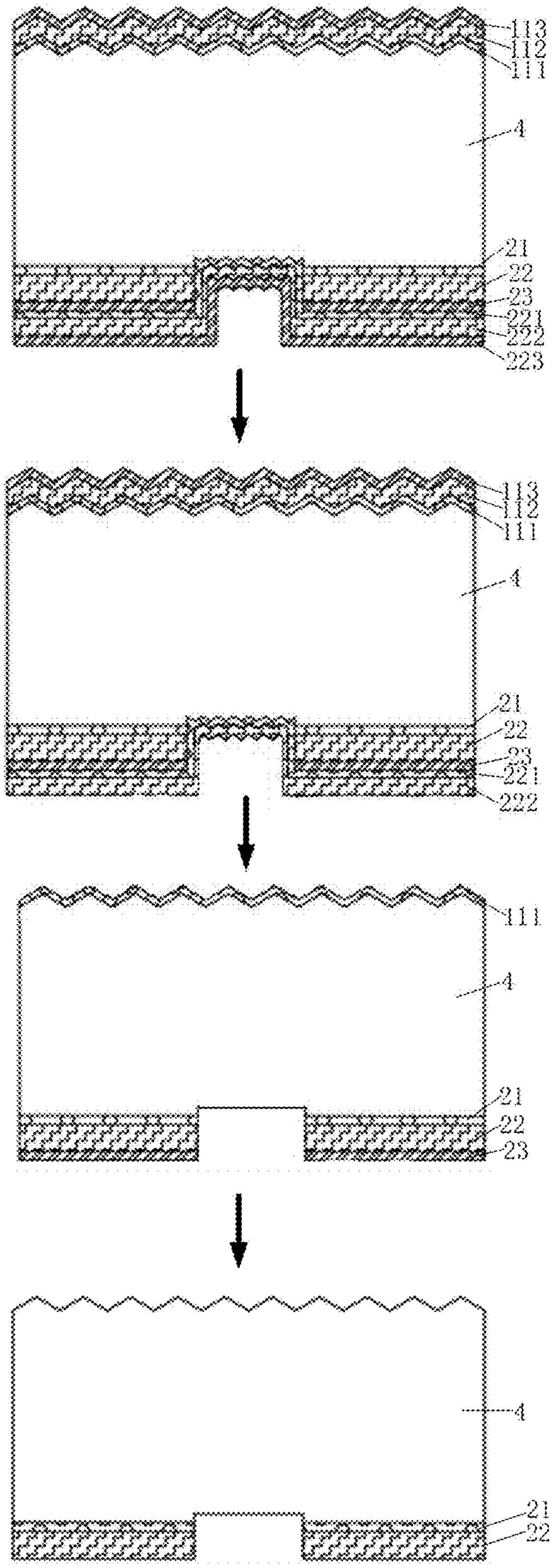
FIG. 8 is a structural schematic diagram showing another preparation process for a P-type back contact cell provided in an embodiment of the present application.

In one optional embodiment, FIG. 7 is a flow chart showing another preparation method for a P-type back contact cell provided in an embodiment of the present application; FIG. 8 is a structural schematic diagram showing another preparation process for a P-type back contact cell provided in an embodiment of the present application. As shown in FIG. 7, the process wafer having the impurity-absorbing structure formed is etched to remove the impurity-absorbing structure and the first phosphosilicate glass layer which is on the second surface side, specifically comprising:

S131, etching the second phosphosilicate glass layer on the second surface side to remove the second phosphosilicate glass layer on the second surface side.

Specifically, referring to FIG. 8, due to the material difference between the second phosphosilicate glass layers 113 and 223 and the second polycrystalline silicon layers 112 and 222, the second phosphosilicate glass layers 113 and 223 and the second polycrystalline silicon layers 112 and 222 cannot be removed at the same time. The acid corrosive solution can be first used to etch the process wafer to remove the second phosphosilicate glass layer 223 on the second surface side, wherein the acid corrosive solution can comprise a hydrogen fluoride solution, a concentration of hydrogen fluoride can range from 75% to 85%, and the reaction can be performed for a period of 30-60 s.

S132, etching the second phosphosilicate glass layer and the second polycrystalline silicon layer which are on the first surface side, and the second polycrystalline silicon layer and the second tunnel layer which are on the second surface side, to form a groove having a polished surface on the second surface side.

Specifically, referring to FIG. 8, after the second phosphosilicate glass layer 223 on the second surface side is removed, an alkaline corrosive solution can be used to etch the process wafer to remove the second phosphosilicate glass layer 113 and the second polycrystalline silicon layer 112 which are on the first surface side, as well as the second polycrystalline silicon layer 222 and the second tunnel layer 221 which are on the second surface side to form a polished surface at the groove on the second surface side, wherein the alkaline corrosive solution can comprise a sodium hydroxide solution, a concentration of sodium hydroxide can range from 1.5% to 5%, and the reaction can be performed for a period of 200-300 s, and the reaction can be performed at a temperature of 65-75° C. The polished surface can fully reflect light with various wavelengths, so that at least part of light which needs to pass through the smooth polished surface to reach the second surface side is reflected into the P-type silicon substrate to realize the reuse of light, improve the utilization rate of light energy, and further improve the photoelectric conversion efficiency of the back contact.

S133, etching the first phosphosilicate glass layer and the second tunnel layer which is on the first surface side to remove the first phosphosilicate glass layer and the second tunnel layer which is on the first surface side.

Specifically, referring to FIG. 8, an acid corrosive solution can be used to etch the second tunnel layer 111 and the first phosphosilicate glass layer 23 of the process wafer, wherein the acid corrosive solution can comprise a hydrogen fluoride solution and a hydrogen chloride solution, a concentration of hydrogen fluoride can range from 8% to 15%, a concentration of hydrogen chloride can range from 4.5% to 10%, and the reaction can be performed for a period of 150-300 s.

Figure 9:
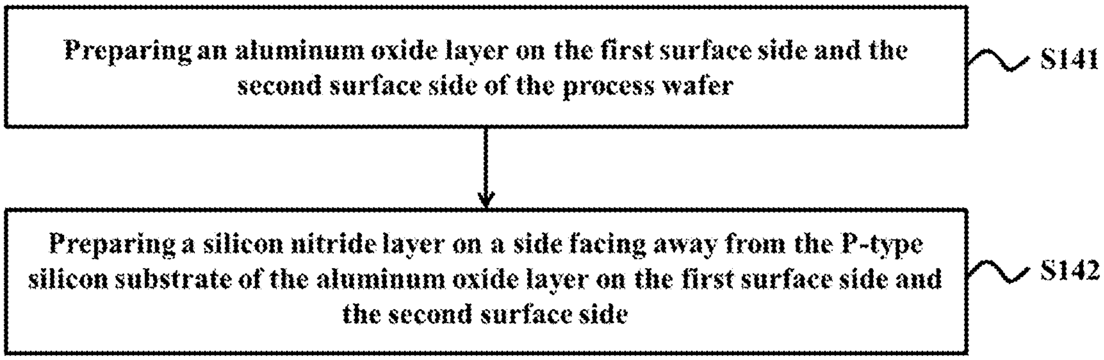
FIG. 9 is a flow chart showing another preparation method for a P-type back contact cell provided in an embodiment of the present application.
Figure 10:
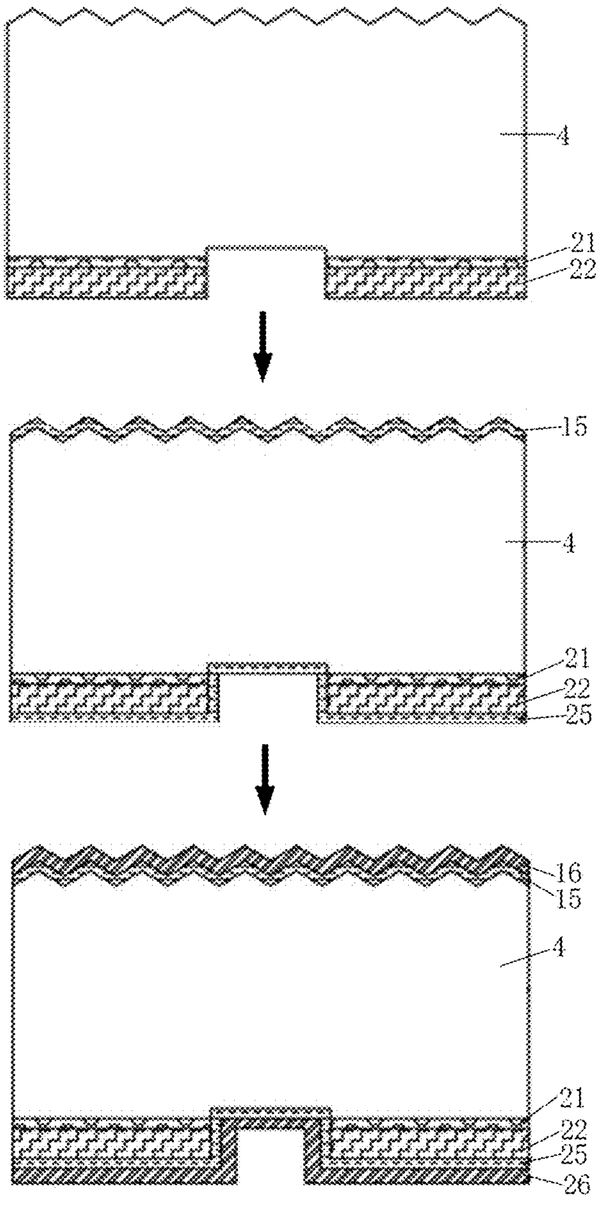
FIG. 10 is a structural schematic diagram showing another preparation process for a P-type back contact cell provided in an embodiment of the present application.

In one optional embodiment, FIG. 9 is a flow chart showing another preparation method for a P-type back contact cell provided in an embodiment of the present application; FIG. 10 is a structural schematic diagram showing another preparation process for a P-type back contact cell provided in an embodiment of the present application. As shown in FIG. 9, a passivation layer is formed on each of the first surface side and the second surface side of the process wafer, specifically comprising:

S141, preparing an aluminum oxide layer on the first surface side and the second surface side of the process wafer.

Specifically, referring to FIG. 10, whole aluminum oxide layers 15 and 25 are formed on the first surface 10 side and the second surface 20 side of the process wafer by atomic layer deposition equipment, and other preparation methods can also be used to form the aluminum oxide layers 15 and 25, and there is no specific limitation here. The thickness of the aluminum oxide layer can be set according to actual needs, and exemplarily, the thickness of the aluminum oxide layer can be 2-10 nm.

S142, preparing a silicon nitride layer on a side of the aluminum oxide layer on the first surface side and the second surface side facing away from the P-type silicon substrate.

Specifically, referring to FIG. 10, after the aluminum oxide layer 15 is prepared on the first surface 10 side and the second surface 20 side of the process wafer, a whole silicon nitride layer can be formed on a side of the aluminum oxide layer on the first surface side and the second surface side facing away from the P-type silicon substrate by using the plasma-enhanced chemistry vapor deposition method, and the aluminum oxide layers 15 and 25 can also be formed by other preparation methods, and there is no specific limitation here. The thickness of the silicon nitride layer can be set according to actual needs, and exemplarily, the thickness of the silicon nitride layer can be 60-180 nm.

Based on the same concept of the present application, an embodiment of the present application provides a P-type back contact cell, and the P-type back contact cell is prepared by the preparation method for a back contact cell in any embodiment of the present application, which has the same beneficial effect as the above method, and can reference the above description and will not be repeated here.

Understandably, the back contact cell provided in the embodiment of the present application can be prepared by the preparation method for a back contact cell in any embodiments of the present application. In the actual production and application, the specific preparation parameters can be adaptively selected according to the parameters mentioned in the embodiments of the present application. The following is a comparison and explanation of P-type back contact cells prepared with different parameters.

In a first embodiment, a P-type silicon substrate was provided, a first tunnel layer and a first polycrystalline silicon layer which were stacked in sequence were formed on each of the first surface side and the second surface side of the P-type silicon substrate by the low-pressure chemical vapor deposition method; the first tunnel layers on the first surface side and the second surface side had the same thickness of 1.8 nm; the first polycrystalline silicon layers on the first surface side and the second surface side had the same thickness of 180 nm; after the first tunnel layer and the first polycrystalline silicon layer which were stacked in sequence were formed on each of the first surface side and the second surface side of the P-type silicon substrate, the process wafer was put into a low-pressure diffusion furnace to form a first phosphosilicate glass layer; the phosphorus source deposition concentrations of the first phosphosilicate glass layers on the first surface side and the second surface side were both $4e^{22}/cm^3$. The P-type silicon substrate was put into an inline etching machine, and the first phosphosilicate glass layer on the first surface side was etched by hydrofluoric acid having a concentration of 85% for an etching period of 60 s to remove the first phosphosilicate glass layer on the first surface side of the P-type silicon substrate; after the first phosphosilicate glass layer on the first surface side of the P-type silicon substrate was removed, a hole was formed on the first phosphosilicate glass layer on the second surface side by the laser etching method, where the laser had a rated power of 40 W and a frequency of 400 KHz, and the hole had a width of 250 μm; after the hole was formed on the first phosphosilicate glass layer on the second surface side, the P-type silicon substrate was put into a texturing machine, and the first polycrystalline silicon layer and the first tunnel layer which were at the hole were etched by a sodium hydroxide solution having a concentration of 5% at an etching temperature of 82° C. for an etching period of 600 s, so as to remove the first polycrystalline silicon layer and the first tunnel layer which were at the hole to form a groove having pyramidal textures; after the groove was formed, a second tunnel layer and a second polycrystalline silicon layer which were stacked in sequence were formed on each of the first surface side and the second surface side of the P-type silicon substrate by the low-pressure chemical vapor deposition method; the second tunnel layers on the first surface side and the second surface side had the same thickness of 1.5 nm; the second polycrystalline silicon layers on the first surface side and the second surface side had the same thickness of 120 nm; after the second tunnel layer and the second polycrystalline silicon layer which were stacked in sequence were formed on each of the first surface side and the second surface side of the P-type silicon substrate, the process wafer was put into a low-pressure diffusion furnace to form a second phosphosilicate glass layer; the phosphorus source deposition concentrations of the second phosphosilicate glass layers on the first surface side and the second surface side were both $2e^{22}/cm^3$; the process wafer having the impurity-absorbing structure formed was put into an inline etching machine, and the second phosphosilicate glass layer on the second surface side was etched by hydrofluoric acid having a concentration of 85% for an etching period of 60 s to remove the second phosphosilicate glass layer on the second surface side; the process wafer with the second phosphosilicate glass layer removed was put into a polishing machine, and the second phosphosilicate glass layer and the second polycrystalline silicon layer which were on the first surface side, and the second polycrystalline silicon layer and the second tunnel layer which were on the second surface side were etched by a sodium hydroxide solution having a concentration of 5% at an etching temperature of 75° C. for an etching period of 300 s, so as to form a polished surface at the groove on the second surface side, and the first surface side remained the structure of pyramidal textures. Then, the first phosphosilicate glass layer on the second surface side and the second tunnel layer on the first surface side were etched by a mixed solution of the hydrogen chloride solution having a concentration of 10% and the hydrogen fluoride solution having a concentration of 15% for an etching period of 300 s; finally, an aluminum oxide layer and a silicon nitride layer were formed on the first surface side and the second surface side by the plasma-enhanced chemical vapor deposition method, where a thickness of the aluminum oxide layer was 10 nm, and a thickness of the silicon nitride layer was 180 nm.

The P-type back contact cell prepared by the above preparation method in the first embodiment was tested, and the result shows the P-type back contact cell had a short-circuit current Isc of 13.643 A, an open-circuit voltage Uoc of 0.7049 V, a fill factor FF of 81.34, and a photoelectric conversion efficiency of 23.70.

In a second embodiment, a P-type silicon substrate was provided, a first tunnel layer and a first polycrystalline silicon layer which were stacked in sequence were formed on each of the first surface side and the second surface side of the P-type silicon substrate by the low-pressure chemical vapor deposition method; the first tunnel layers on the first surface side and the second surface side had the same thickness of 1.1 nm; the first polycrystalline silicon layers on the first surface side and the second surface side had the same thickness of 70 nm; after the first tunnel layer and the first polycrystalline silicon layer which were stacked in sequence were formed on each of the first surface side and the second surface side of the P-type silicon substrate, the process wafer was put into a low-pressure diffusion furnace to form a first phosphosilicate glass layer; the phosphorus source deposition concentrations of the first phosphosilicate glass layers on the first surface side and the second surface side were both $3e^{21}/cm^3$; the P-type silicon substrate was put into an inline etching machine, and the first phosphosilicate glass layer on the first surface side was etched by hydrofluoric acid having a concentration of 75% for an etching period of 30 s to remove the first phosphosilicate glass layer on the first surface side of the P-type silicon substrate; after the first phosphosilicate glass layer on the first surface side of the P-type silicon substrate was removed, a hole was formed on the first phosphosilicate glass layer on the second surface side by the laser etching method, where the laser had a rated power of 20 W and a frequency of 350 KHz, and the hole had a width of 150 μm; after the hole was formed on the first phosphosilicate glass layer on the second surface side, the P-type silicon substrate was put into a texturing machine, and the first polycrystalline silicon layer at the hole were etched by a sodium hydroxide solution having a concentration of 1.3% at an etching temperature of 74° C. for an etching period of 350 s, so as to remove the first polycrystalline silicon layer and the first tunnel layer which were at the hole to form a groove having pyramidal textures, and at this time, the first surface side also had pyramidal textures; after the groove was formed, a second tunnel layer and a second polycrystalline silicon layer which were stacked in sequence were formed on each of the first surface side and the second surface side of the P-type silicon substrate by the low-pressure chemical vapor deposition method; the second tunnel layers on the first surface side and the second surface side had the same thickness of 1.0 nm; the second polycrystalline silicon layers on the first surface side and the second surface side had the same thickness of 60 nm; after the second tunnel layer and the second polycrystalline silicon layer which were stacked in sequence were formed on each of the first surface side and the second surface side of the P-type silicon substrate, the process wafer was put into a low-pressure diffusion furnace to form a second phosphosilicate glass layer; the phosphorus source deposition concentrations of the second phosphosilicate glass layers on the first surface side and the second surface side were both $1e^{20}/cm^3$; the process wafer having the impurity-absorbing structure formed was put into an inline etching machine, and the second phosphosilicate glass layer on the second surface side was etched by hydrofluoric acid having a concentration of 75% for an etching period of 30 s, so as to remove the second phosphosilicate glass layer on the second surface side; the process wafer with the second phosphosilicate glass layer removed was put into a polishing machine, and the second phosphosilicate glass layer and the second polycrystalline silicon layer which were on the first surface side, and the second polycrystalline silicon layer and the second tunnel layer which were on the second surface side were etched by a sodium hydroxide solution having a concentration of 1.5% at an etching temperature of 65° C. for an etching period of 200 s, so as to form a polished surface at the groove on the second surface side, and the first surface side remained the textured structure. Then, the first phosphosilicate glass layer on the second surface side and the second tunnel layer on the first surface side were etched by a mixed solution of the hydrogen chloride solution having a concentration of 4.5% and the hydrogen fluoride solution having a concentration of 8% for an etching period of 150 s; finally, an aluminum oxide layer and a silicon nitride layer were formed on the first surface side and the second surface side by the plasma-enhanced chemical vapor deposition method, where a thickness of the aluminum oxide layer was 2 nm, and a thickness of the silicon nitride layer was 60 nm.

The P-type back contact cell prepared by the above preparation method in the second embodiment was tested, and the result shows the P-type back contact cell had a short-circuit current Isc of 13.642 A, an open-circuit voltage Uoc of 0.7052 V, a fill factor FF of 81.33, and a photoelectric conversion efficiency of 23.70.

In a third embodiment, a P-type silicon substrate was provided, a first tunnel layer and a first polycrystalline silicon layer which were stacked in sequence were formed on each of the first surface side and the second surface side of the P-type silicon substrate by the low-pressure chemical vapor deposition method; the first tunnel layers on the first surface side and the second surface side had the same thickness of 1.5 nm; the first polycrystalline silicon layers on the first surface side and the second surface side had the same thickness of 120 nm; after the first tunnel layer and the first polycrystalline silicon layer which were stacked in sequence were formed on each of the first surface side and the second surface side of the P-type silicon substrate, the process wafer was put into a low-pressure diffusion furnace to form a first phosphosilicate glass layer; the phosphorus source deposition concentrations of the first phosphosilicate glass layers on the first surface side and the second surface side were both $8e^{21}/cm^3$. The P-type silicon substrate was put into an inline etching machine, and the first phosphosilicate glass layer on the first surface side was etched by hydrofluoric acid having a concentration of 80% for an etching period of 45 s to remove the first phosphosilicate glass layer on the first surface side of the P-type silicon substrate; after the first phosphosilicate glass layer on the first surface side of the P-type silicon substrate was removed, a hole was formed on the first phosphosilicate glass layer on the second surface side by the laser etching method, where the laser had a rated power of 30 W and a frequency of 600 KHz, and the hole had a width of 200 μm; after the hole was formed on the first phosphosilicate glass layer on the second surface side, the P-type silicon substrate was put into a texturing machine, and the first polycrystalline silicon layer and the first tunnel layer which were at the hole were etched by a sodium hydroxide solution having a concentration of 2.6% at an etching temperature of 78° C. for an etching period of 500 s, so as to remove the first polycrystalline silicon layer and the first tunnel layer which were at the hole to form a groove having pyramidal textures, and at this time, the first surface side also had pyramidal textures; after the groove was formed, a second tunnel layer and a second polycrystalline silicon layer which were stacked in sequence were formed on each of the first surface side and the second surface side of the P-type silicon substrate by the low-pressure chemical vapor deposition method; the second tunnel layers on the first surface side and the second surface side had the same thickness of 1.2 nm; the second polycrystalline silicon layers on the first surface side and the second surface side had the same thickness of 90 nm; after the second tunnel layer and the second polycrystalline silicon layer which were stacked in sequence were formed on each of the first surface side and the second surface side of the P-type silicon substrate, the process wafer was put into a low-pressure diffusion furnace to form a second phosphosilicate glass layer; the phosphorus source deposition concentrations of the second phosphosilicate glass layers on the first surface side and the second surface side were both $1e^{21}/cm^3$; the process wafer having the impurity-absorbing structure formed was put into an inline etching machine, and the second phosphosilicate glass layer on the second surface side was etched by hydrofluoric acid having a concentration of 80% for an etching period of 45 s, so as to remove the second phosphosilicate glass layer on the second surface side; the process wafer with the second phosphosilicate glass layer removed was put into a polishing machine, and the second phosphosilicate glass layer and the second polycrystalline silicon layer which were on the first surface side, and the second polycrystalline silicon layer and the second tunnel layer which were on the second surface side were etched by a sodium hydroxide solution having a concentration of 2.5% at an etching temperature of 70° C. for an etching period of 250 s, so as to form a polished surface at the groove on the second surface side, and the first surface side remained the structure of pyramidal textures; then, the first phosphosilicate glass layer on the second surface side and the second tunnel layer on the first surface side were etched by a mixed solution of the hydrogen chloride solution having a concentration of 7% and the hydrogen fluoride solution having a concentration of 12% for an etching period of 200 s; finally, an aluminum oxide layer and a silicon nitride layer were formed on the first surface side and the second surface side by the plasma-enhanced chemical vapor deposition method, where a thickness of the aluminum oxide layer was 6 nm, and a thickness of the silicon nitride layer was 120 nm.

The P-type back contact cell prepared by the above preparation method in the third embodiment was tested, and the result shows the P-type back contact cell had a short-circuit current Isc of 13.648 A, an open-circuit voltage Uoc of 0.7054 V, a fill factor FF of 81.43, and a photoelectric conversion efficiency of 23.75.

In a first comparative embodiment, a P-type silicon substrate was provided, a first tunnel layer and a first polycrystalline silicon layer which were stacked in sequence were formed on each of the first surface side and the second surface side of the P-type silicon substrate by the low-pressure chemical vapor deposition method; the first tunnel layers on the first surface side and the second surface side had the same thickness of 1.8 nm; the first polycrystalline silicon layers on the first surface side and the second surface side had the same thickness of 180 nm; after the first tunnel layer and the first polycrystalline silicon layer which were stacked in sequence were formed on each of the first surface side and the second surface side of the P-type silicon substrate, the process wafer was put into a low-pressure diffusion furnace to form a first phosphosilicate glass layer; the phosphorus source deposition concentrations of the first phosphosilicate glass layers on the first surface side and the second surface side were both $4e^{22}/cm^3$. The P-type silicon substrate was put into an inline etching machine, and the first phosphosilicate glass layer on the first surface side was etched by hydrofluoric acid having a concentration of 85% for an etching period of 60 s to remove the first phosphosilicate glass layer on the first surface side of the P-type silicon substrate; after the first phosphosilicate glass layer on the first surface side of the P-type silicon substrate was removed, a hole was formed on the first phosphosilicate glass layer on the second surface side by the laser etching method, where the laser had a rated power of 40 W and a frequency of 400 KHz, and the hole had a width of 250 μm; after the hole was formed on the first phosphosilicate glass layer on the second surface side, the P-type silicon substrate was put into a texturing machine, and the first polycrystalline silicon layer and the first tunnel layer which were at the hole, and the first polycrystalline silicon layer and the first tunnel layer which were on the first surface side were etched by a sodium hydroxide solution having a concentration of 5% at an etching temperature of 82° C. for an etching period of 600 s, so as to form pyramidal textures at the hole and on the first surface side; then, the first phosphosilicate glass layer on the second surface side was etched by a mixed solution of the hydrogen chloride solution having a concentration of 10% and the hydrogen fluoride solution having a concentration of 15% for an etching period of 300 s; subsequently, an aluminum oxide layer and a silicon nitride layer were formed on the first surface side and the second surface side by the plasma-enhanced chemical vapor deposition method, where a thickness of the aluminum oxide layer was 10 nm, and a thickness of the silicon nitride layer was 180 nm.

The P-type back contact cell prepared by the above preparation method in the first comparative embodiment was tested, and the result shows the P-type back contact cell had a short-circuit current Isc of 13.543 A, an open-circuit voltage Uoc of 0.7051 V, a fill factor FF of 81.30, and a photoelectric conversion efficiency of 23.52.

In a second comparative embodiment, a P-type silicon substrate was provided, a first tunnel layer and a first polycrystalline silicon layer which were stacked in sequence were formed on each of the first surface side and the second surface side of the P-type silicon substrate by the low-pressure chemical vapor deposition method; the first tunnel layers on the first surface side and the second surface side had the same thickness of 1.1 nm; the first polycrystalline silicon layers on the first surface side and the second surface side had the same thickness of 70 nm; after the first tunnel layer and the first polycrystalline silicon layer which were stacked in sequence were formed on each of the first surface side and the second surface side of the P-type silicon substrate, the process wafer was put into a low-pressure diffusion furnace to form a first phosphosilicate glass layer; the phosphorus source deposition concentrations of the first phosphosilicate glass layers on the first surface side and the second surface side were both $3e^{21}/cm^3$; the P-type silicon substrate was put into an inline etching machine, and the first phosphosilicate glass layer on the first surface side was etched by hydrofluoric acid having a concentration of 75% for an etching period of 30 s to remove the first phosphosilicate glass layer on the first surface side of the P-type silicon substrate; after the first phosphosilicate glass layer on the first surface side of the P-type silicon substrate was removed, a hole was formed on the first phosphosilicate glass layer on the second surface side by the laser etching method, where the laser had a rated power of 20 W and a frequency of 350 KHz, and the hole had a width of 150 μm; after the hole was formed on the first phosphosilicate glass layer on the second surface side, the P-type silicon substrate was put into a texturing machine, and the first polycrystalline silicon layer and the first tunnel layer which were at the hole, and the first polycrystalline silicon layer and the first tunnel layer which were on the first surface side were etched by a sodium hydroxide solution having a concentration of 1.3% at an etching temperature of 74° C. for an etching period of 350 s, so as to form pyramidal textures at the hole and on the first surface side; then, the first phosphosilicate glass layer on the second surface side were etched by a mixed solution of the hydrogen chloride solution having a concentration of 4.5% and the hydrogen fluoride solution having a concentration of 8% for an etching period of 150 s; subsequently, an aluminum oxide layer and a silicon nitride layer were formed on the first surface side and the second surface side by the plasma-enhanced chemical vapor deposition method, where a thickness of the aluminum oxide layer was 2 nm, and a thickness of the silicon nitride layer was 60 nm.

The P-type back contact cell prepared by the above preparation method in the second comparative embodiment was tested, and the result shows the P-type back contact cell had a short-circuit current Isc of 13.544 A, an open-circuit voltage Uoc of 0.7052 V, a fill factor FF of 81.28, and a photoelectric conversion efficiency of 23.52.

The photoelectric conversion efficiency Eta is related to the open-circuit voltage Uoc, the short-circuit current Isc, and the fill factor FF. By comparing the P-type back contact cells of the first embodiment to the third embodiment with the P-type back contact cells of the first comparative embodiment and the second comparative embodiment, it can be determined that the P-type back contact cells prepared by the preparation method provided in the present application all have improved photoelectric conversion efficiency Eta, that is, the preparation method for the P-type back contact cell provided in the present application can effectively improve the photoelectric conversion efficiency of the P-type back contact cell.

Based on the same concept in the present application, an embodiment of the present application also provides a photovoltaic module comprising the P-type back contact cell provided by the embodiments of the present application, which can achieve the beneficial effects of the P-type back contact cell provided by the embodiments of the present application, and the above description can be referred to with regard to the similarities and will not be repeated here.

It should be noted that the above is only preferred embodiments and the used technical principles of the present application. Those skilled in the art should understand that the present application is not limited to the specific embodiments herein, and those skilled in the art can make any obvious changes, realignments, combinations, and substitutions without departing from the protection scope of the present application. Therefore, the present application is described in detail by the above embodiments, but the present application is not limited to the above embodiments. Without departing from the conception of the present application, the present application can also comprise more other equivalent embodiments, and the scope of the present application is determined by the scope of the claims in the present application.

What is claimed is:

1. A preparation method for a P-type back contact cell, comprising:

preparing a process wafer of the P-type back contact cell; the process wafer comprises a P-type silicon substrate; the P-type silicon substrate comprises a first surface and a second surface which are opposite; the second surface side is provided with a first tunnel layer, a first polycrystalline silicon layer, and a first phosphosilicate glass layer which are stacked in sequence, as well as a groove breaking through the first tunnel layer, the first polycrystalline silicon layer, and the first phosphosilicate glass layer;

forming an impurity-absorbing structure on the first surface side and/or the second surface side; the impurity-absorbing structure comprises a second tunnel layer, a second polycrystalline silicon layer, and a second phosphosilicate glass layer which are stacked;

etching the process wafer having the impurity-absorbing structure formed to remove the impurity-absorbing structure and the first phosphosilicate glass layer which is on the second surface side; and forming a passivation layer on each of the first surface side and the second surface side of the process wafer.

2. The preparation method according to claim 1, wherein the preparation of the process wafer of the P-type back contact cell comprises:

providing the P-type silicon substrate;

forming the first tunnel layer, the first polycrystalline silicon layer, and the first phosphosilicate glass layer which are stacked in sequence on each of the first surface side and the second surface side of the P-type silicon substrate;

forming a hole on the first phosphosilicate glass layer on the second surface side to expose a part of the first polycrystalline silicon layer on the second surface side;

after the hole is formed on the first phosphosilicate glass layer on the second surface side, removing the first phosphosilicate glass layer on the first surface side of the P-type silicon substrate to expose the first polycrystalline silicon layer on the first surface side; and etching on the first surface side and the second surface side of the P-type silicon substrate, based on which the first polycrystalline silicon layer and the first tunnel layer inside the hole are removed to form the groove at the hole, and the first tunnel layer and the first polycrystalline silicon layer which are located on the first surface side are removed.

3. The preparation method according to claim 1, wherein the preparation of the process wafer of the P-type back contact cell comprises:

providing the P-type silicon substrate;

forming the first tunnel layer, the first polycrystalline silicon layer, and the first phosphosilicate glass layer which are stacked in sequence on each of the first surface side and the second surface side of the P-type silicon substrate;

removing the first phosphosilicate glass layer on the first surface side of the P-type silicon substrate to expose the first polycrystalline silicon layer on the first surface side;

after the first phosphosilicate glass layer on the first surface side of the P-type silicon substrate is removed, forming a hole on the first phosphosilicate glass layer on the second surface side to expose a part of the first polycrystalline silicon layer on the second surface side; and etching on the first surface side and the second surface side of the P-type silicon substrate, based on which the first polycrystalline silicon layer and the first tunnel layer inside the hole are removed to form the groove at the hole, and the first tunnel layer and the first polycrystalline silicon layer which are located on the first surface side are removed.

4. The preparation method according to claim 2, wherein etching on the first surface side and the second surface side of the P-type silicon substrate comprises:

using an alkaline corrosive solution to corrode on the first surface side and at the hole on the second surface side of the P-type silicon substrate, based on which the first polycrystalline silicon layer and the first tunnel layer inside the hole are removed to form the groove at the hole, and the first tunnel layer and the first polycrystalline silicon layer which are located on the first surface side are removed.

5. The preparation method according to claim 2, wherein forming the hole on the first phosphosilicate glass layer on the second surface side to expose a part of the first polycrystalline silicon layer on the second surface side comprises:

using laser to form the hole on the first phosphosilicate glass layer on the second surface side of the P-type silicon substrate.

6. The preparation method according to claim 1, wherein forming the impurity-absorbing structure on the first surface side and/or the second surface side comprises:

sequentially preparing the first tunnel layer, the first polycrystalline silicon layer, and the first phosphosilicate glass layer on the first surface side and the second surface side by any one of high-temperature thermal oxidation, nitric acid oxidation, ozone oxidation, and chemical vapor deposition.

7. The preparation method according to claim 1, wherein etching the process wafer having the impurity-absorbing structure formed to remove the impurity-absorbing structure and the first phosphosilicate glass layer which is on the second surface side comprises:

etching the second phosphosilicate glass layer on the second surface side to remove the second phosphosilicate glass layer on the second surface side;

etching the second phosphosilicate glass layer and the second polycrystalline silicon layer which are on the first surface side, and the second polycrystalline silicon layer and the second tunnel layer which are on the second surface side to form a groove having a polished surface on the second surface side; and etching the first phosphosilicate glass layer and the second tunnel layer which is on the first surface side to remove the first phosphosilicate glass layer and the second tunnel layer which is on the first surface side.

8. The preparation method according to claim 1, wherein forming the passivation layer on each of the first surface side and the second surface side of the process wafer comprises:

preparing an aluminum oxide layer on the first surface side and the second surface side of the process wafer; and preparing a silicon nitride layer on a side facing away from the P-type silicon substrate of the aluminum oxide layer on the first surface side and the second surface side.

9. The preparation method according to claim 3, wherein etching on the first surface side and the second surface side of the P-type silicon substrate comprises:

using an alkaline corrosive solution to corrode on the first surface side and at the hole on the second surface side of the P-type silicon substrate, based on which the first polycrystalline silicon layer and the first tunnel layer inside the hole are removed to form the groove at the hole, and the first tunnel layer and the first polycrystalline silicon layer which are located on the first surface side are removed.

10. The preparation method according to claim 3, wherein forming the hole on the first phosphosilicate glass layer on the second surface side to expose a part of the first polycrystalline silicon layer on the second surface side comprises:

using laser to form the hole on the first phosphosilicate glass layer on the second surface side of the P-type silicon substrate.

* * * * *